(12) United States Patent
Park et al.

(10) Patent No.: US 11,476,445 B2
(45) Date of Patent: Oct. 18, 2022

(54) DISPLAY DEVICE HAVING A CONTACT UNIT

(71) Applicant: LG Display Co., Ltd., Seoul (KR)

(72) Inventors: Geondo Park, Paju-si (KR); HwaDong Han, Goyang-si (KR); Taekyun Kim, Goyang-si (KR); Jinwoo Lee, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 47 days.

(21) Appl. No.: 16/935,733

(22) Filed: Jul. 22, 2020

(65) Prior Publication Data

US 2021/0043871 A1  Feb. 11, 2021

(30) Foreign Application Priority Data

Aug. 5, 2019 (KR) .................. 10-2019-0094998

(51) Int. Cl.
*H01L 51/52* (2006.01)
*H01L 27/32* (2006.01)
(Continued)

(52) U.S. Cl.
CPC ...... *H01L 51/5253* (2013.01); *H01L 51/0097* (2013.01); *G02F 1/133305* (2013.01); *G06F 1/1641* (2013.01); *G06F 1/1652* (2013.01); *G09F 9/301* (2013.01); *H01L 27/3211* (2013.01); *H01L 27/3213* (2013.01);
(Continued)

(58) Field of Classification Search
CPC ............. H01L 51/5253; H01L 51/0097; H01L 51/5203; H01L 51/5221; H01L 27/3248; H01L 27/3279; H01L 27/3246; H01L 29/78615; H01L 33/38; H01L 2251/538; H01L 27/3211; H01L 27/322; H01L 27/3213; H01L 33/44; H01L 51/5234; H01L 2251/301; G02F 2001/133357; G02F 1/133305; G06F 1/1641; G06F 1/1652; G09F 9/301
See application file for complete search history.

(56) References Cited

U.S. PATENT DOCUMENTS 10,600,854 B2   3/2020  Kim et al.
2014/0353622 A1* 12/2014  You ................... H01L 27/3258
                                              257/40
(Continued)

FOREIGN PATENT DOCUMENTS

KR   10-2017-0115149 A   10/2017

*Primary Examiner* — Ida M Soward
(74) *Attorney, Agent, or Firm* — Fenwick & West LLP

(57) ABSTRACT

A display device includes a substrate which includes a display area and a non-display area adjacent to the display area, a first planarization layer which is at least partially disposed in the display area, a second planarization layer which is disposed in the non-display area and is spaced apart from the first planarization layer, a contact unit disposed between the first planarization layer and the second planarization layer in the non-display area, and a cathode which extends from the display area to the non-display area to be electrically connected to the contact unit. Accordingly, the first planarization layer and the second planarization layer are spaced apart from each other so that a path through which moisture permeates into the display area through the second planarization layer may be blocked.

15 Claims, 10 Drawing Sheets

(51) Int. Cl.
*G02F 1/133* (2006.01)
*G09F 9/30* (2006.01)
*G06F 1/16* (2006.01)
*H01L 51/00* (2006.01)
*H01L 33/38* (2010.01)
*H01L 29/786* (2006.01)
*G02F 1/1333* (2006.01)
*H01L 33/44* (2010.01)

(52) U.S. Cl.
CPC .... *H01L 27/3248* (2013.01); *H01L 29/78615* (2013.01); *H01L 33/38* (2013.01); *H01L 33/44* (2013.01); *H01L 51/5203* (2013.01); *H01L 51/5234* (2013.01); *H01L 2251/301* (2013.01); *H01L 2251/306* (2013.01); *H01L 2251/308* (2013.01); *H01L 2251/5338* (2013.01)

(56) References Cited

U.S. PATENT DOCUMENTS

| | | | |
|---|---|---|---|
| 2017/0287995 A1* | 10/2017 | Kim | H01L 27/3276 |
| 2018/0006259 A1* | 1/2018 | Paek | H01L 51/5203 |
| 2018/0033998 A1* | 2/2018 | Kim | H01L 51/5253 |
| 2018/0061918 A1* | 3/2018 | Park | H01L 27/3258 |
| 2018/0120658 A1* | 5/2018 | Kanaya | G02F 1/136227 |
| 2018/0138214 A1* | 5/2018 | Lee | G02F 1/136286 |
| 2019/0012031 A1* | 1/2019 | Kim | G06F 3/0412 |
| 2019/0095007 A1* | 3/2019 | Jeong | H01L 27/3276 |
| 2019/0324567 A1* | 10/2019 | Hong | H01L 51/5281 |
| 2020/0127233 A1* | 4/2020 | Sung | H01L 27/3258 |
| 2020/0219965 A1* | 7/2020 | Kim | H01L 27/3262 |
| 2020/0243782 A1* | 7/2020 | Maruyama | H05B 33/12 |
| 2020/0258963 A1* | 8/2020 | Lhee | H01L 27/3276 |
| 2020/0321415 A1* | 10/2020 | Kim | H01L 27/3246 |
| 2020/0343331 A1* | 10/2020 | Jeong | H01L 51/5256 |
| 2020/0365668 A1* | 11/2020 | Lee | H01L 27/3258 |
| 2021/0036093 A1* | 2/2021 | Okabe | H01L 51/5246 |
| 2021/0057510 A1* | 2/2021 | Watanabe | G09F 9/40 |
| 2021/0091168 A1* | 3/2021 | Choi | G09G 3/3258 |
| 2021/0098538 A1* | 4/2021 | Kato | G06F 3/0445 |
| 2021/0143238 A1* | 5/2021 | Kim | G09G 3/3208 |
| 2021/0175321 A1* | 6/2021 | Chung | H01L 27/0296 |
| 2021/0193787 A1* | 6/2021 | Won | H01L 27/323 |

* cited by examiner

DISPLAY DEVICE HAVING A CONTACT UNIT

CROSS-REFERENCE TO RELATED APPLICATIONS

This application claims priority to Republic of Korea Patent Application No. 10-2019-0094998 filed on Aug. 5, 2019, in the Korean Intellectual Property Office, the disclosure of which is incorporated herein by reference in its entirety.

BACKGROUND

Field

The present disclosure relates to a display device, and more particularly, to a display device which minimizes moisture permeation through a planarization layer and a bank to improve a deterioration of an organic light emitting diode.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate such as plastic which is a flexible material so as to be capable of displaying images even though the display device is bent or rolled like a paper is getting attention as a next generation display device.

SUMMARY

An object to be achieved by the present disclosure is to provide a display device which reduces moisture which permeates into the display device.

Another object to be achieved by the present disclosure is to provide a display device which improves the deterioration of an organic light emitting diode due to moisture.

Still another object to be achieved by the present disclosure is to provide a display device which improves a contact resistance between a contact unit which supplies a low potential power voltage to a cathode and the cathode.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a display device includes a substrate which includes a display area and a non-display area adjacent to the display area, a first planarization layer which is at least partially disposed in the display area, a second planarization layer which is disposed in the non-display area and is spaced apart from the first planarization layer, a contact unit disposed between the first planarization layer and the second planarization layer in the non-display area, and a cathode which extends from the display area to the non-display area to be electrically connected to the contact unit. Accordingly, the first planarization layer and the second planarization layer are spaced apart from each other so that a path through which moisture permeates into the display area through the second planarization layer may be blocked.

In order to achieve the above-described object, according to another aspect of the present disclosure, a display device includes a substrate which includes a display area, a plurality of routing areas extending from the display area, and a plurality of contact areas disposed between the plurality of routing areas, a plurality of flexible films which is electrically connected to the plurality of routing areas at one end of the substrate, a first planarization layer which is disposed in the display area, some of the plurality of routing areas adjacent to the display area, and some of the plurality of contact areas adjacent to the plurality of routing areas, a second planarization layer which is disposed in the plurality of contact areas and is spaced apart from the first planarization layer, a cathode which is disposed in the display area, some of the plurality of routing areas adjacent to the display area, and some of the plurality of contact areas adjacent to the display area, and a contact unit which is disposed in each of the plurality of contact areas and is electrically connected to the cathode. The plurality of routing areas is radially disposed with respect to the plurality of flexible films and the plurality of contact areas is radially disposed with respect to the display area. Therefore, the moisture which permeates into the first planarization layer through the second planarization layer is reduced to improve the reliability of the display device.

Other detailed matters of the exemplary embodiments are included in the detailed description and the drawings.

According to the present disclosure, designs of a planarization layer and a bank which have a moisture absorbing property are changed to reduce the deterioration of the organic light emitting diode due to the moisture.

According to the present disclosure, a planarization layer of a display area and a planarization layer of a non-display area are spaced apart from each other to reduce the permeation of the moisture into the display area through the planarization layer.

According to the present disclosure, the planarization layer and the bank are disposed in the non-display area to improve a step coverage of a contact unit to supply a low potential power voltage and lower a resistance of a cathode.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Figure 1:
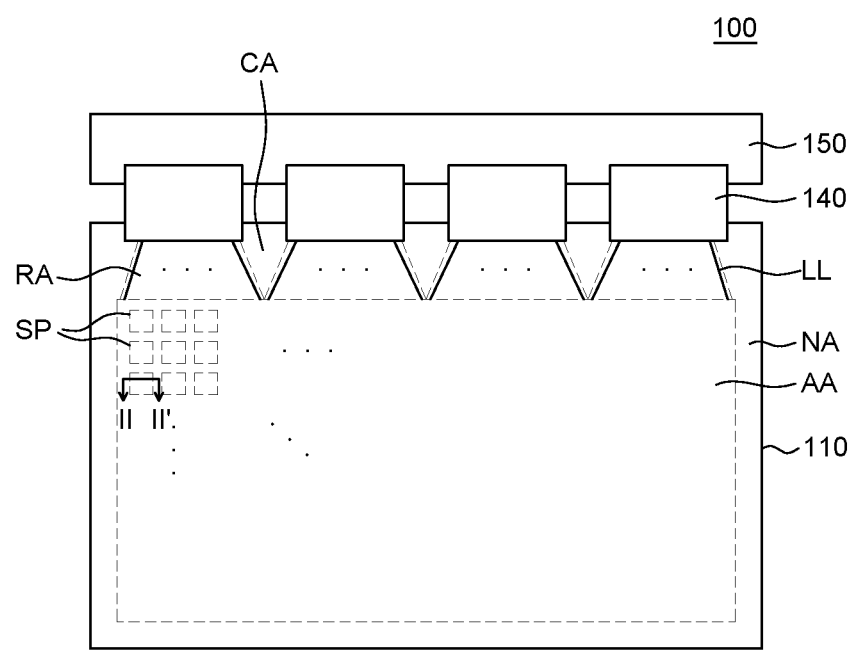
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a plan view of a display device according to an exemplary embodiment of the present disclosure. For the convenience of description, in FIG. 1, among various components of the display device 100, only a substrate 110, a plurality of sub pixels SP, a plurality of link lines LL, a plurality of flexible films 140, and a printed circuit board 150 are illustrated.

The substrate 110 is a support member for supporting other components of the display device 100 and may be configured by an insulating material. For example, the substrate 110 may be formed of glass or resin. Further, the substrate 110 may be configured to include plastics such as polymer or polyimide PI or may be formed of a material having flexibility.

Further, the display device 100 including the substrate 110 which is formed of a material having a flexibility may be implemented as a foldable display device or a rollable display device manufactured such that even though the display device 100 is folded or rolled, the image can be displayed. For example, when the display device 100 is formed as a foldable display device, the display device 100 may fold or unfold the substrate 110 with respect to a folding axis. As another example, when the display device 100 is formed as a rollable display device, the display device 100 may include a back cover disposed on one surface of the substrate 110 having a flexibility and a roller to which the substrate 110 and the back cover are wound or unwound. When the rollable display device is not used, the substrate 110 and the back cover are rolled around the roller to be stored with a reduced volume. In contrast, when the rollable display device is used, the rolled rollable display device is unrolled again to be used. The display device 100 according to the exemplary embodiment of the present disclosure may be formed as a flexible display device such as a foldable display device or a rollable display device, but is not limited thereto.

The substrate 110 includes a display area AA and a non-display area NA.

The display area AA is an area where images are displayed. In the display area AA, a plurality of sub pixels SP which displays images and a circuit unit for driving the plurality of sub pixels SP may be disposed. The circuit unit may include various transistors, capacitors, and wiring lines for driving the plurality of sub pixels SP. For example, the circuit unit may include various components such as a driving thin film transistor, a switching thin film transistor, a storage capacitor, a gate line, and a data line, but is not limited thereto.

The non-display area NA is an area where no image is displayed and various wiring lines and driving ICs for driving the plurality of sub pixels SP disposed in the display area AA are disposed. For example, in the non-display area NA, various driving ICs such as a gate driver IC and a data driver IC may be disposed.

In the meantime, even though in FIG. 1, the non-display area NA is defined as an area which encloses the display area AA, the non-display area NA may be defined as an area extending from one side of the display area AA, but is not limited thereto.

The non-display area NA includes a plurality of routing areas RA and a plurality of contact areas CA.

The plurality of routing areas RA is an area extending from the display area AA to the plurality of flexible films 140. A plurality of link lines LL is disposed in the plurality of routing areas RA.

The plurality of link lines LL may transmit a signal from the printed circuit board 150 and the plurality of flexible films 140 to the plurality of sub pixels SP. The link lines LL may connect the driving ICs of the printed circuit board 150 and the plurality of flexible films 140 to the plurality of wiring lines of the display area AA. Therefore, the link lines LL may transmit the signal to the plurality of wiring lines of the display area AA.

The plurality of link lines LL may be formed of a conductive material. For example, the plurality of link lines LL may be formed of one of various materials used to manufacture the organic light emitting diode and the transistors of the display area AA and configured as a single layer or a multi-layer. For example, the link lines LL may be formed of molybdenum (Mo), chrome (Cr), titanium (Ti), nickel (Ni), neodymium (Nd), copper (Cu), and an alloy of silver (Ag) and magnesium (Mg).

The plurality of link lines LL may be radially disposed with respect to the plurality of flexible films 140. The plurality of wiring lines of the display area AA may be disposed in the entire display area AA with a constant interval. Further, in order to transmit a signal from each of the plurality of flexible films 140 to the plurality of wiring lines of the display area AA, each of the plurality of link lines LL may be disposed so as to correspond to the plurality of wiring lines. For example, the plurality of link lines LL connected to a flexible film 140 which is disposed at a leftmost side of the plurality of flexible films 140 may be connected from a leftmost wiring line of the display area AA to the wiring line in the display area AA. Therefore, the plurality of link lines LL may radially extend toward the plurality of wiring lines of the display area AA from the plurality of flexible films 140.

Further, the plurality of routing areas RA in which the plurality of link lines LL is disposed may also be radially formed. Each of the plurality of routing areas RA may be radially disposed with respect to the plurality of flexible films 140. For example, the plurality of routing areas RA may be a triangular shape, but is not limited thereto.

The plurality of contact areas CA is disposed between the plurality of routing areas RA and a plurality of contact units 160 is disposed.

In each of the plurality of contact areas CA, a plurality of contact units is disposed. The plurality of contact units is disposed in the contact area CA between the plurality of routing areas RA to supply a low potential power voltage VSS to the display area AA. Each of the plurality of contact units is electrically connected to the plurality of flexible films 140 to be supplied with the low potential power voltage from the plurality of flexible films 140. The plurality of contact units will be described in more detail with reference to FIG. 3, and FIGS. 4A to 4E.

The plurality of contact areas CA may be radially disposed with respect to the display area AA. The plurality of contact areas CA which is enclosed by the routing areas RA radially formed may also be radially formed. For example, the plurality of link lines LL and the plurality of routing areas RA are radially disposed with respect to the plurality of flexible films 140 so that the plurality of routing areas RA may be formed to be a triangular shape. The plurality of contact areas CA enclosed by the plurality of triangular routing areas RA may be formed to be an inverted triangular shape. However, the shape of the plurality of contact areas CA may vary in accordance with the arrangement of the plurality of routing areas RA and the plurality of link lines LL, but is not limited thereto.

The plurality of flexible films 140 is disposed at one end of the substrate 110. The plurality of flexible films 140 is connected to the plurality of routing areas RA at one end of the substrate 110. The plurality of flexible films 140 is films in which various components are disposed on a base film having malleability to supply a signal to the plurality of sub pixels SP and the driving circuit of the display area AA. One ends of the plurality of flexible films 140 are disposed in the routing areas RA of the non-display area NA to supply a power voltage or a data voltage to the plurality of sub pixels SP and the driving circuits of the display area AA through the plurality of link lines LL. In the meantime, even though the plurality of flexible films 140 is four in FIG. 1, the number of the plurality of flexible films 140 may vary depending on the design, but is not limited thereto.

In the meantime, a driving IC such as a gate driver IC or a data driver IC may be disposed on the plurality of flexible films 140. The driving IC is a component which processes data for displaying images and a driving signal for processing the data. The driving IC may be disposed by a chip on glass (COG), a chip on film (COF), or a tape carrier package (TCP) technique depending on a mounting method. However, for the convenience of description, it is described that the driving IC is mounted on the plurality of flexible films 140 by a chip on film technique, but is not limited thereto.

The printed circuit board 150 is connected to the plurality of flexible films 140. The printed circuit board 150 is a component which supplies signals to the driving IC. Various components may be disposed in the printed circuit board 150 to supply various driving signals such as a driving signal or a data signal to the driving IC. In the meantime, even though one printed circuit board 150 is illustrated in FIG. 1, the number of printed circuit boards 150 may vary depending on the design, but is not limited thereto.

The plurality of sub pixels SP is disposed in the display area AA of the substrate 110. Each of the plurality of sub pixels SP is an individual unit which emits light and in each of the plurality of sub pixels SP, a light emitting diode and a driving circuit are formed. For example, the plurality of sub pixels SP may include a red sub pixel, a green sub pixel, and a blue sub pixel, but is not limited thereto and the plurality of sub pixels SP may further include a white sub pixel.

Hereinafter, the plurality of sub pixels SP will be described in more detail with reference to FIG. 2.

Figure 2:
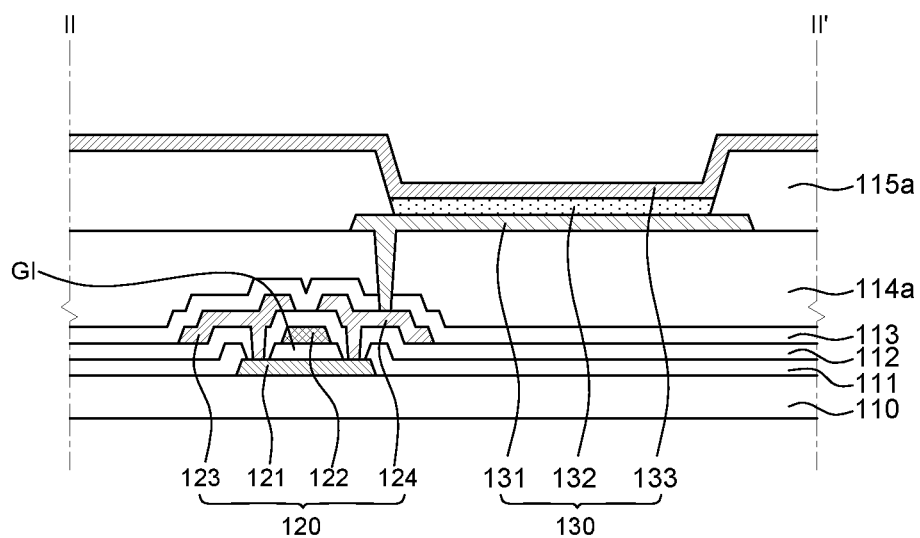
FIG. 2 is a cross-sectional view taken along the line II-II' of FIG. 1 according to an embodiment of the present disclosure.

FIG. 2 is a cross-sectional view taken along the line II-II' of FIG. 1 according to an embodiment of the present disclosure. Referring to FIG. 2, the display device 100 according to the exemplary embodiment of the present disclosure includes a substrate 110, a buffer layer 111, a gate insulating layer GI, an interlayer insulating layer 112, a transistor 120, a passivation layer 113, a first planarization layer 114a, an organic light emitting diode 130, and a first bank 115a.

The buffer layer 111 is disposed on the substrate 110. The buffer layer 111 suppresses moisture and/or oxygen which permeate from the outside of the substrate 110 from being spread. The buffer layer 111 may be formed of an inorganic material, for example, may be configured by a single layer or a double layer of silicon oxide SiOx and silicon nitride SiNx, but is not limited thereto.

The transistor 120 is disposed on the buffer layer 111. The transistor 120 may be disposed in each of the plurality of sub pixels SP of the display area AA. The transistor 120 disposed in each of the plurality of sub pixels SP may be used as a driving element of the display device 100. For example, the transistor 120 may be a thin film transistor (TFT), an N-channel metal oxide semiconductor (NMOS) transistor, a P-channel metal oxide semiconductor (PMOS) transistor, a complementary metal oxide semiconductor (CMOS) transistor, or a field effect transistor FET, but is not limited thereto. Hereinafter, the plurality of transistors 120 is assumed as thin film transistors, but is not limited thereto.

The transistor 120 includes a gate electrode 122, an active layer 121, a source electrode 123, and a drain electrode 124.

The active layer 121 of the transistor 120 is disposed on the buffer layer 111. For example, the active layer 121 may be formed of an oxide semiconductor, amorphous silicon, or polysilicon, but is not limited thereto.

The gate electrode 122 is disposed on the active layer 121. The gate electrode 122 may be formed of a conductive material such as copper (Cu), aluminum (Al), molybdenum (Mo), titanium (Ti), or an alloy thereof, but it not limited thereto.

The gate insulating layer GI is disposed between the gate electrode 122 and the active layer 121. The gate insulating layer GI is a layer for insulating the gate electrode 122 from the active layer 121. The gate insulating layer GI may be formed of an inorganic material, for example, may be configured by a single layer or a double layer of silicon oxide SiOx and silicon nitride SiNx, but is not limited thereto.

The interlayer insulating layer 112 is disposed on the gate electrode 122 and the active layer 121. The interlayer insulating layer 112 insulates the gate electrode 122 from the source electrode 123 and the drain electrode 124. The interlayer insulating layer 112 may be formed of an inorganic material, for example, may be configured by a single layer or a double layer of silicon oxide SiOx and silicon nitride SiNx, but is not limited thereto.

The source electrode 123 and the drain electrode 124 are disposed on the interlayer insulating layer 112 to be spaced apart from each other. The source electrode 123 and the drain electrode 124 are electrically connected to the active layer 121 through a contact hole formed in the interlayer insulating layer 112. The source electrode 123 and the drain electrode 124 may be formed of a conductive material such as copper (Cu), aluminum (Al), molybdenum (Mo), titanium (Ti), or an alloy thereof, but are not limited thereto.

The passivation layer 113 is disposed on the transistor 120. The passivation layer 113 is an insulating layer for protecting components below the passivation layer 113. The passivation layer 113 may be formed of an inorganic material, for example, may be configured by a single layer or a double layer of silicon oxide SiOx and silicon nitride SiNx, but is not limited thereto. Further, the passivation layer 113 may be omitted depending on the design.

The first planarization layer 114a is disposed on the passivation layer 113. The first planarization layer 114a may planarize an upper portion of the substrate 110 including the transistor 120. The first planarization layer 114a may be disposed in the entire display area AA and a part of the non-display area NA. The first planarization layer 114a may be formed of an organic material, and for example, may be formed by a single layer or a double layer of an acrylic-based organic material, but is not limited thereto. The first planarization layer 114a disposed in the part of the non-display area NA will be described in more detail with reference to FIG. 3.

A light emitting diode 130 is disposed on the first planarization layer 114a in the display area AA. The organic light emitting diode 130 is a self-emitting element which emits light and is disposed in the plurality of sub pixels SP to be driven by the plurality of transistors 120. The organic light emitting diode 130 includes an anode 131, an organic light emitting layer 132, and a cathode 133.

In the meantime, the display device 100 may be configured by a top emission type or a bottom emission type, depending on an emission direction of light which is emitted from the organic light emitting diode 130.

According to the top emission type, light emitted from the organic light emitting diode 130 is emitted to an upper portion of the substrate 110 on which the organic light emitting diode 130 is formed. In the case of the top emission type, a reflective layer may be formed below the anode 131 to allow the light emitted from the organic light emitting diode 130 to travel to the upper portion of the substrate 110, that is, toward the cathode 133.

According to the bottom emission type, light emitted from the organic light emitting diode 130 is emitted to a lower portion of the substrate 110 on which the organic light emitting diode 130 is formed. In the case of the bottom emission type, the anode 131 may be formed only of a transparent conductive material to allow the light emitted from the organic light emitting diode 130 to travel to the lower portion of the substrate 110 and the cathode 133 may be formed of the metal material having a high reflectance.

Hereinafter, for the convenience of description, the description will be made by assuming that the display device 100 according to the exemplary embodiment of the present disclosure is a bottom emission type display device 100, but it is not limited thereto.

The anode 131 may supply holes to the organic light emitting layer 132 and may be formed of a conductive material having a high work function. For example, the anode 131 may be formed of tin oxide (TO), indium tin oxide (ITO), indium zinc oxide (IZO), or indium zinc tin oxide (ITZO), but is not limited thereto.

The first bank 115a is disposed on the anode 131. The first bank 115a is disposed to overlap the display area AA and cover the edge of the anode 131. The first bank 115a is disposed at the boundary between the sub pixels SP which are adjacent to each other to reduce the color mixture of light emitted from the organic light emitting diode 130 of each of the plurality of sub pixels SP. For example, the first bank 115a may be formed of an insulating material such as polyimide, acryl, or benzocyclobutene (BCB)-based resin, but it is not limited thereto.

The organic light emitting layer 132 is disposed on the anode 131 exposed from the first bank 115a. The organic light emitting layer 132 is supplied with the holes from the anode 131 and supplied with electrons from the cathode 133 to emit light. The organic light emitting layer 132 may be formed of a red organic light emitting layer, a green organic light emitting layer, a blue organic light emitting layer, and a white organic light emitting layer depending on a color of light emitted from the organic light emitting layer 132. In this case, when the organic light emitting layer 132 is a white organic light emitting layer, color filters having various colors may be additionally disposed.

The cathode 133 is disposed on the organic light emitting layer 132 and the first bank 115a. The cathode 133 may be at least disposed on the entire surface of the display area AA. The cathode 133 may supply electrons to the organic light emitting layer 132 and may be formed of a conductive material having a low work function. For example, the cathode 133 may be formed of any one or more selected from the group consisting of metals such as magnesium (Mg), silver (Ag), and aluminum (Al), and an alloy thereof, but is not limited thereto. Further, since the display device 100 is a bottom emission type, the cathode 133 may reflect the light emitted from the organic light emitting layer 132 toward the substrate 110.

In the meantime, the cathode 133 may be disposed not only in the display area AA, but also in the non-display area NA to be electrically connected to the plurality of contact units and supplied with a low potential power voltage from the plurality of contact units.

Hereinafter, the plurality of contact units will be described in more detail with reference to FIG. 3, and FIGS. 4A to 4E.

Figure 3:
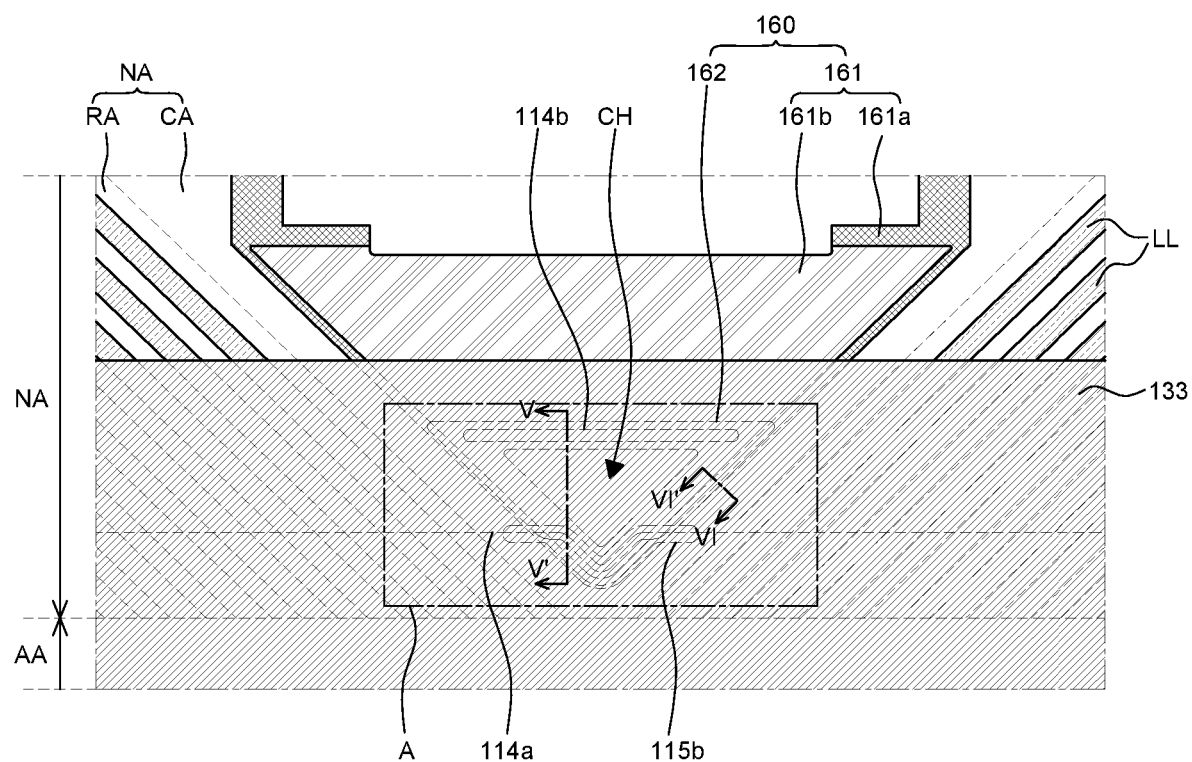
FIG. 3 is an enlarged plan view of a contact area of a display device according to an exemplary embodiment of the present disclosure.
Figure 4A:
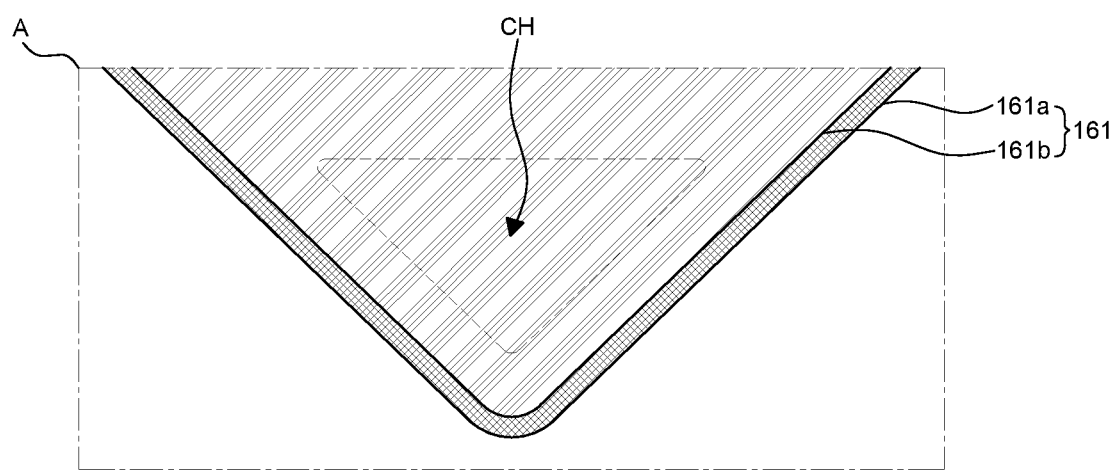
FIGS. 4A to 4E are enlarged plan views of an area A of FIG. 3 according to an embodiment of the present disclosure.
Figure 4B:
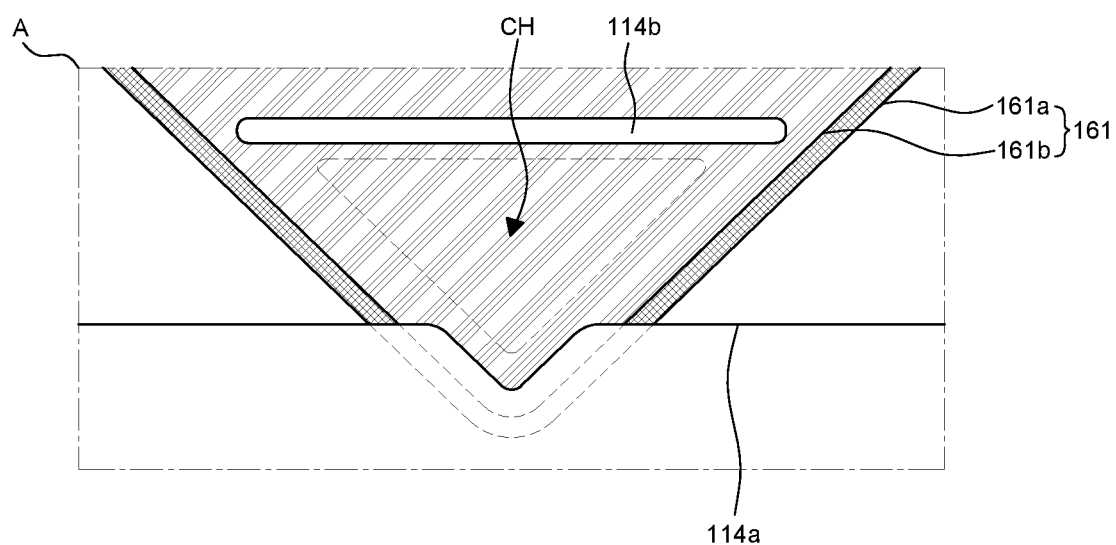
Figure 4C:
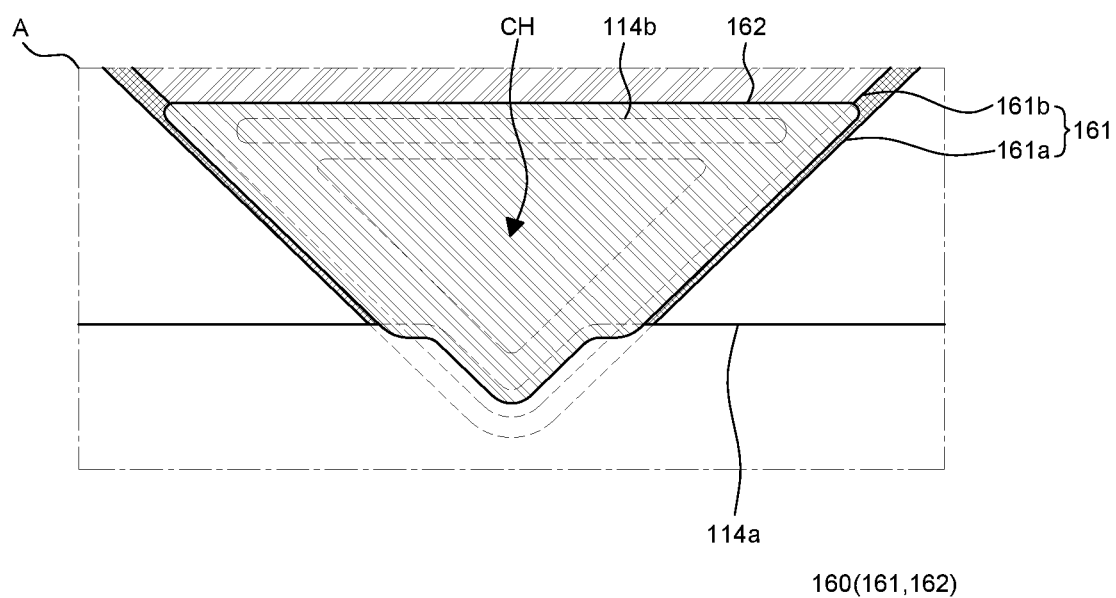
Figure 4D:
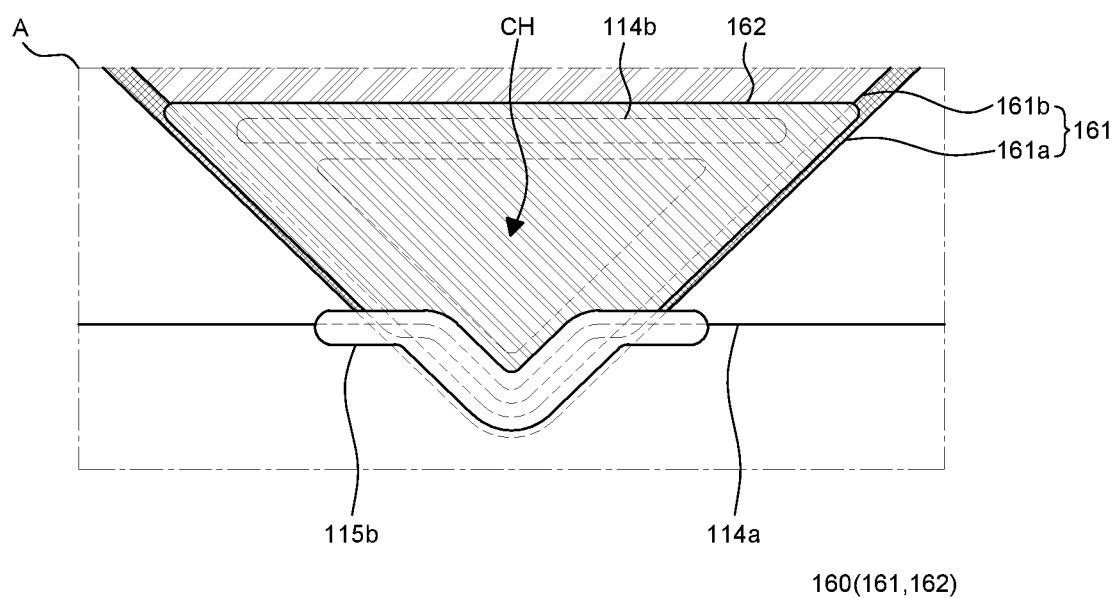
Figure 4E:
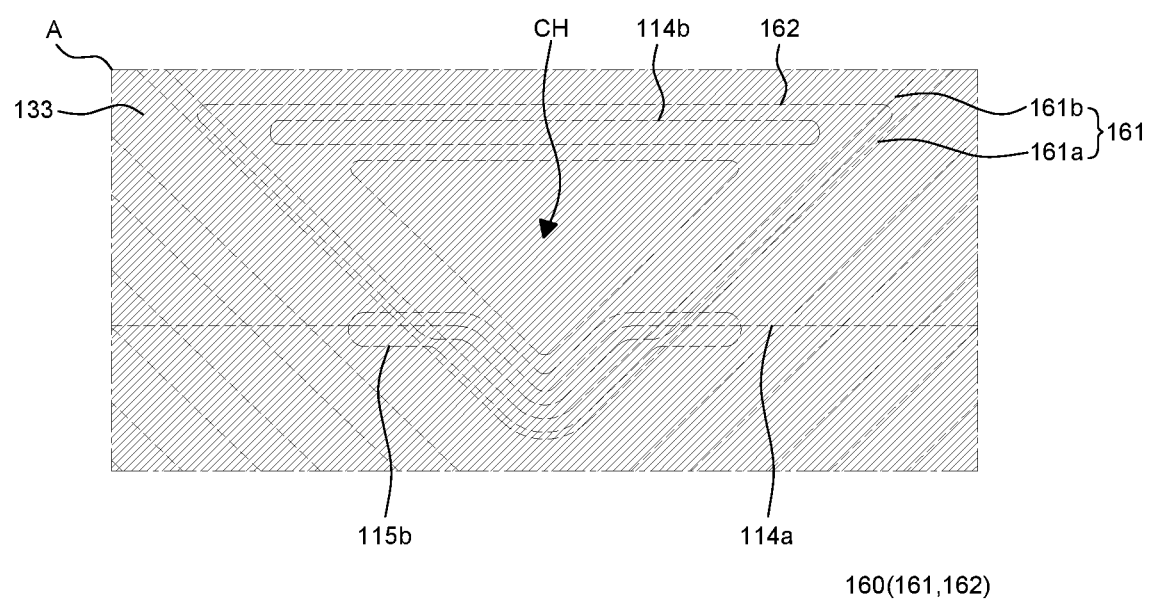

FIG. 3 is an enlarged plan view of a contact area of a display device according to an exemplary embodiment of the present disclosure. FIGS. 4A to 4E are enlarged plan views of an area A of FIG. 3. FIGS. 4A to 4E are schematic plan views for explaining a contact unit 160 of the display device 100 according to an exemplary embodiment of the present disclosure. FIG. 4A is a schematic plan view for explaining a metal layer 161 and a contact hole CH of the contact unit 160. FIG. 4B is a schematic plan view for explaining a first planarization layer 114a and a second planarization layer 114b. FIG. 4C is a schematic plan view for explaining a transparent conductive layer 162 of the contact unit 160. FIG. 4D is a schematic plan view for explaining a second bank 115b. FIG. 4E is a schematic plan view for explaining a cathode 133.

Referring to FIG. 3, each of the plurality of contact units 160 includes one or more metal layers 161 and a transparent conductive layer 162.

Referring to FIGS. 3 and 4A, one or more metal layers 161 are disposed on the substrate 110. The metal layer 161 may be formed of a material which is the same as a part of a driving element of the display area AA. The metal layer 161 may be formed of the same material as any one of materials which form a transistor 120 which is a driving element of the display area AA. For example, the metal layer 161 may include a first metal layer 161a and a second metal layer 161b disposed on the first metal layer 161a. Further, the first metal layer 161a is formed of the same material as the gate electrode 122 of the transistor 120 and the second metal layer 161b is formed of the same material as the source electrode 123 and the drain electrode 124 of the transistor 120. However, one or more metal layers 161 of the contact unit 160 may be formed of the same material as any one of materials which form the plurality of wiring lines or a storage capacitor disposed in the display area AA in addition to the transistor 120, but is not limited thereto.

In the meantime, the metal layer 161 extends to the plurality of flexible films 140 to be electrically connected to the plurality of flexible films 140. For example, among the metal layers 161, the first metal layer 161a extends to the plurality of flexible films 140 to be supplied with a low potential power voltage from the plurality of flexible films 140.

In this case, as described above, the metal layer 161 may be formed of the same material as the gate electrode 122, the source electrode 123, and the drain electrode 124 which are formed of copper (Cu), aluminum (Al), molybdenum (Mo), titanium (Ti) or an alloy thereof. Copper (Cu), aluminum (Al), molybdenum (Mo), titanium (Ti) or an alloy thereof has a low specific resistance, so that the signal delay may be reduced. Accordingly, the metal layer 161 which is formed of a material having a low specific resistance is electrically connected to the plurality of flexible films 140 to be supplied with a low potential power voltage. Therefore, the transmission delay of the low potential power voltage may be reduced and the low potential power voltage may be easily supplied to the display area AA.

In the meantime, one or more insulating layers may be disposed on the metal layer 161. Further, in order to electrically connect the metal layer 161 to the transparent conductive layer 162 to be described later, a contact hole CH may be formed in one or more insulating layers to expose the metal layer 161. For example, the passivation layer 113 or the interlayer insulating layer 112 disposed from the display area AA to the non-display area NA is disposed between the metal layer 161 and the transparent conductive layer 162 and the contact hole CH which exposes the metal layer 161 is disposed in the passivation layer 113 or the interlayer insulating layer 112. Hereinafter, for the convenience of description, the passivation layer 113 is assumed as one or more insulating layers disposed on the metal layer 161.

Further, even though it is not illustrated in FIG. 3 for the convenience of description, an insulating layer in which a contact hole is formed may be further disposed between the first metal layer 161a and the second metal layer 161b. For example, the interlayer insulating layer 112 is disposed between a first metal layer 161a and a second metal layer 161b and a contact hole which exposes the first metal layer 161a may be formed in the interlayer insulating layer 112 to electrically connect the first metal layer 161a and the second metal layer 161b. However, even though in FIGS. 3 and 4A, it is described that the metal layer 161 includes a first metal layer 161a and a second metal layer 161b, the metal layer 161 may be formed as a single layer. When the metal layer 161 is formed as a single layer, the interlayer insulating layer 112 may not be disposed, and it is not limited thereto.

Next, referring to FIGS. 3 and 4B, the first planarization layer 114a and the second planarization layer 114b are disposed on the metal layer 161.

The first planarization layer 114a is disposed in a part of the non-display area NA from the display area AA. The first planarization layer 114a is disposed in the display area AA, some of the plurality of routing areas RA which is adjacent to the display area AA, and some of the plurality of contact areas CA which is adjacent to the plurality of routing areas RA. Specifically, an edge of the first planarization layer 114a extending to some of the plurality of routing areas RA adjacent to the display area AA may be disposed to be parallel to an edge of the display area AA adjacent to the plurality of routing areas RA. Further, since the first planarization layer 114a is disposed in a part of the contact area CA adjacent to the plurality of routing areas RA, the edge of the first planarization layer 114a may be disposed along the edge of the plurality of routing areas RA in the plurality of contact areas CA. For example, the edge of the first planarization layer 114a is formed to have a concave shape such as a V shape in a portion corresponding to the plurality of contact areas CA. Further, in a portion corresponding to the plurality of routing areas RA, the edge of the first planarization layer 114a is disposed to be parallel to the edge of the display area AA adjacent to the plurality of routing areas RA.

The second planarization layer 114b is disposed in the plurality of contact areas CA. The second planarization layer 114b may be disposed to be parallel to the edge of the display area AA adjacent to the plurality of routing areas RA and the plurality of contact areas CA. The second planarization layer 114b may be formed of the same material by the same process as the first planarization layer 114a. In this case, the second planarization layer 114b is formed to be spaced apart from the contact hole CH which exposes the metal layer 161 in the plurality of contact areas CA to electrically connect the metal layer 161 to the transparent conductive layer 162 to be described below. That is, the second planarization layer 114b may not be disposed to fill the contact hole CH.

The second planarization layer 114b may be disposed to be spaced apart from the first planarization layer 114a. The second planarization layer 114b may be disposed to be spaced apart from the first planarization layer 114a to have an island shape. Further, since the second planarization layer 114b is spaced apart from the first planarization layer 114a, even though the moisture permeates into the second planarization layer 114b, the moisture does not affect the first planarization layer 114a. Therefore, the permeation of the moisture into the organic light emitting diode 130 of the display area AA may be minimized. Specifically, the first planarization layer 114a and the second planarization layer 114b have a property of absorbing the moisture. Further, when the organic light emitting diode 130 disposed in the display area AA is in contact with the external moisture or oxygen, the organic light emitting diode 130 is deteriorated, which results in the defect of the display device 100. Therefore, the second planarization layer 114bwhich has a property of absorbing moisture and is disposed to be adjacent to an outermost side of the display device 100 is spaced apart from the first planarization layer 114a disposed to the display area AA. Therefore, a moisture permeation path to the first planarization layer 114a through the second planarization layer 114b may be blocked and the reliability of the organic light emitting diode 130 may be improved.

Referring to FIGS. 3 and 4C, the transparent conductive layer 162 of the contact unit 160 is disposed on the metal layer 161 in the contact area CA. The transparent conductive layer 162 is disposed on the first planarization layer 114a and the second planarization layer 114b to be electrically connected to the metal layer 161 through the contact hole CH. The transparent conductive layer 162 may be formed of the same material as a part of the organic light emitting diode 130 of the display area AA. For example, the transparent conductive layer 162 may be formed of the same material as the anode 131 of the organic light emitting diode 130 which is formed of a transparent conductive material.

The transparent conductive layer 162 is disposed so as to cover the edge of the first planarization layer 114a disposed in the contact area CA. The edge of the transparent conductive layer 162 adjacent to the first planarization layer 114a may be disposed on a top surface of the first planarization layer 114a. The edge of the transparent conductive layer 162 disposed in a part of the contact area CA in which the first planarization layer 114a is not disposed may be disposed on one or more insulating layers.

The transparent conductive layer 162 is disposed so as to cover the entire second planarization layer 114b disposed in the contact area CA. The transparent conductive layer 162 is in contact with a top surface and a side surface of the second planarization layer 114b. An edge of the transparent conductive layer 162 may be disposed to be spaced apart from the second planarization layer 114b.

In the meantime, as the edge of the transparent conductive layer 162 is disposed to be spaced apart from the second planarization layer 114b, disconnection of the cathode 133 and a resistance increase range of the cathode 133 may be reduced in the vicinity of an edge of the transparent conductive layer 162. This will be described below with reference to FIG. 5.

Referring to FIGS. 3 and 4D, the second bank 115b is disposed on the transparent conductive layer 162 in the contact area CA. The second bank 115b may be formed of the same material as the first bank 115a of the display area AA by the same process. The second bank 115b may be disposed so as to cover the edge of the transparent conductive layer 162 which covers the edge of the first planarization layer 114a disposed in the contact area CA. The second bank 115b may be disposed so as to cover an edge of the transparent conductive layer 162 disposed on the top surface of the first planarization layer 114a, among the edges of the transparent conductive layer 162.

In the meantime, the edge of the transparent conductive layer 162 may be bent with respect to the second bank 115b. Specifically, some edges disposed at the outside of the second bank 115b, among the edges of the transparent conductive layer 162 adjacent to the routing area RA, may protrude so as to be adjacent to the routing area RA more than the other edge overlapping the second bank 115b. However, the edge of the transparent conductive layer 162 overlapping the second bank 115b may be straightly formed, but a shape of the transparent conductive layer 162 is not limited thereto.

Referring to FIG. 4E, the cathode 133 is disposed on the transparent conductive layer 162 and the second bank 115b. The cathode 133 may be disposed to extend from the display area AA to the non-display area NA. The cathode 133 may be disposed in the display area AA, some of the plurality of routing areas RA adjacent to the display area AA, and some of the plurality of contact areas CA adjacent to the display area AA. Further, the cathode 133 disposed in the plurality of contact areas CA is disposed so as to cover the transparent conductive layer 162 to be electrically connected to the transparent conductive layer 162. The cathode 133 is in contact with the transparent conductive layer 162 which is electrically connected to the metal layer 161 to be electrically connected to the metal layer 161. Accordingly, the cathode 133 is electrically connected to the plurality of flexible films 140 to be supplied with the low potential power voltage through the metal layer 161 to which the low potential power voltage is supplied and the transparent conductive layer 162 which is in contact with the metal layer 161 through the contact hole CH.

Hereinafter, the plurality of contact units 160 will be described in more detail with reference to FIGS. 5 and 6.

Figure 5:
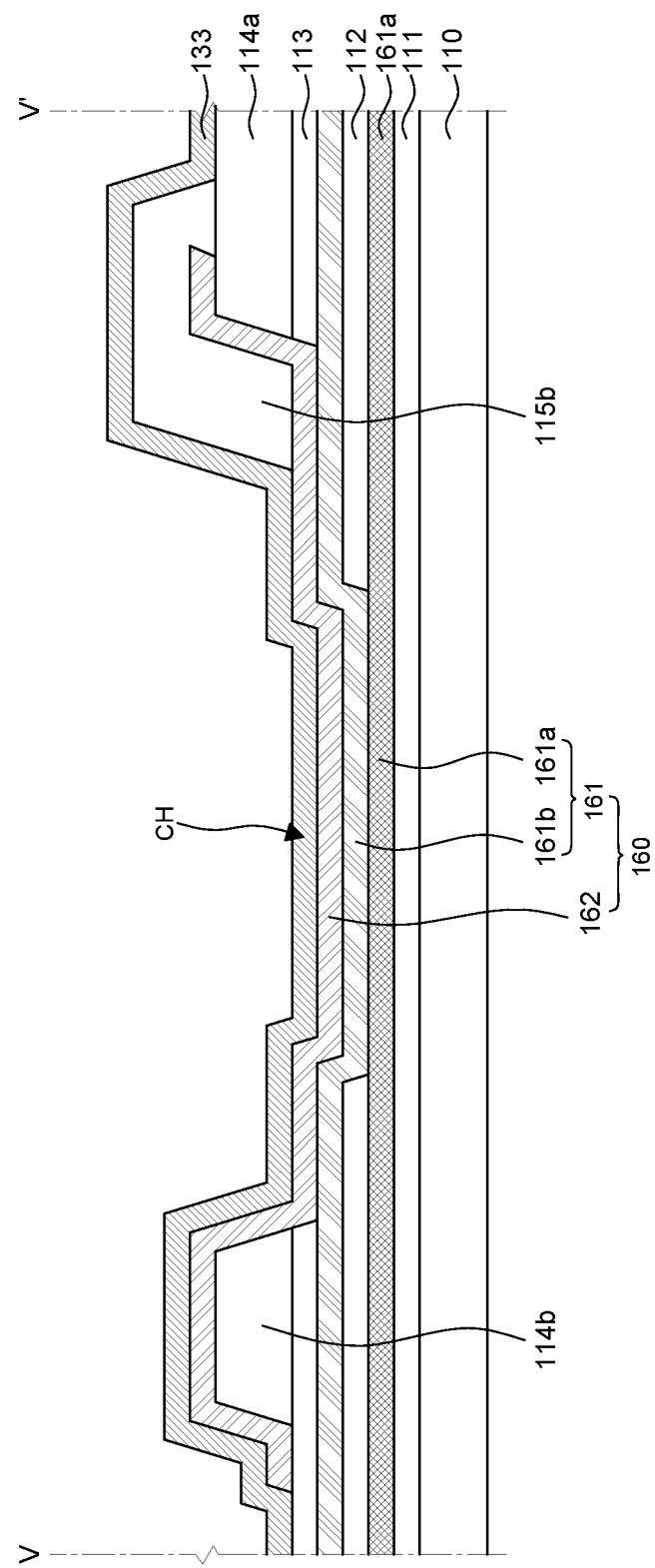
FIG. 5 is a cross-sectional view taken along the line V-V' of FIG. 3 according to an embodiment of the present disclosure.
Figure 6:
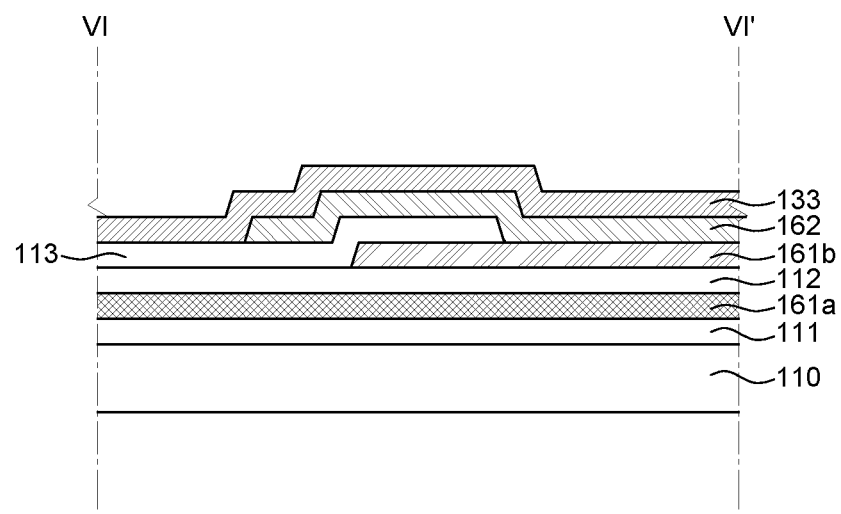
FIG. 6 is a cross-sectional view taken along the line VI-VI' of FIG. 3 according to an embodiment of the present disclosure.

FIG. 5 is a cross-sectional view taken along the line V-V' of FIG. 3, and FIG. 6 is a cross-sectional view taken along the line VI-VI' of FIG. 3 according to an embodiment of the present disclosure.

Referring to FIGS. 5 and 6, the buffer layer 111, the first metal layer 161a, the interlayer insulating layer 112, the second metal layer 161b, and the passivation layer 113 are sequentially disposed on the substrate 110.

As described above, the first metal layer 161a and the second metal layer 161b may be formed of the same material as the gate electrode 122, the source electrode 123, and the drain electrode 124 of the transistor 120 of the display area AA by the same process. The interlayer insulating layer 112 and the passivation layer 113 may be disposed to extend from the display area AA to the non-display area NA.

Referring to FIGS. 5 and 6, a contact hole CH which exposes the metal layer 161 is formed in the passivation layer 113. The contact hole CH is formed in the passivation layer 113 so as to correspond to the edge of the first planarization layer 114a and the edge of the second planarization layer 114b. Specifically, the contact hole CH of the passivation layer 113 is formed so as to correspond to the edge of the first planarization layer 114a which faces the second planarization layer 114b and the edge of the second planarization layer 114b which faces the first planarization layer 114a. The contact hole CH of the passivation layer 113 may expose the second metal layer 161b between the first planarization layer 114a and the second planarization layer 114b.

The contact hole CH is also formed in the interlayer insulating layer 112 in an area adjacent to the edge of the first planarization layer 114a and the edge of the second planarization layer 114b. Specifically, the contact hole CH which exposes the first metal layer 161a is formed in the interlayer insulating layer 112 between the first planarization layer 114a and the second planarization layer 114b. Further, the first metal layer 161a and the second metal layer 161b are in contact with each other to be electrically connected to each other through the contact holes CH formed in the interlayer insulating layer 112.

In the meantime, the edge of the transparent conductive layer 162 is disposed on the top surface of the first planarization layer 114a. The edge of the transparent conductive layer 162 on the top surface of the first planarization layer 114a may be formed to have a reverse tapered shape. Specifically, the transparent conductive layer 162 may be formed by forming a material which forms the transparent conductive layer 162 on the first planarization layer 114a and the second planarization layer 114b and then etching the material. When the material which forms the transparent conductive layer 162 is etched using an etchant, since the first planarization layer 114a formed of an organic material has a high hygroscopicity to absorb the etchant, a bottom surface of the transparent conductive layer 162 which is in contact with the first planarization layer 114a may be more etched. Therefore, when the edge of the transparent conductive layer 162 is disposed on the first planarization layer 114a, the bottom surface of the transparent conductive layer 162 which is in contact with the first planarization layer 114a is excessively etched. Therefore, the edge of the transparent conductive layer 162 on the top surface of the first planarization layer 114a may be formed to have a reverse tapered shape.

The second bank 115b is disposed so as to cover the edge of the transparent conductive layer 162 having a reverse tapered shape on the first planarization layer 114a. Since the second bank 115b is disposed so as to cover the edge of the transparent conductive layer 162 having a reverse tapered shape, the disconnection of the cathode 133 at the edge of the transparent conductive layer 162 may be reduced and the resistance increase range of the cathode 133 may be reduced. For example, when the cathode 133 is directly formed on the edge of the transparent conductive layer 162 having a reverse tapered shape, the thickness of the cathode 133 may be reduced at the edge of the transparent conductive layer 162. Therefore, when the cathode 133 is directly formed on the edge of the transparent conductive layer 162 having a reverse tapered shape, the resistance may be increased due to the reduced thickness of the cathode 133 or disconnection may occur.

Accordingly, after forming the second bank 115b on the edge of the transparent conductive layer 162 having a reverse tapered shape, the cathode 133 may be formed on the second bank 115b. The second bank 115b suppresses the contact between the edge of the transparent conductive layer 162 having a reverse tapered shape and the cathode 133 to reduce the reduction in a thickness of a part of the cathode 133 which is adjacent to the edge of the transparent conductive layer 162 and increase in the resistance.

The transparent conductive layer 162 is disposed so as to cover the second planarization layer 114b. The edge of the transparent conductive layer 162 is disposed so as to be spaced apart from the second planarization layer 114b. If the edge of the transparent conductive layer 162 is disposed on the second planarization layer 114b, since the second planarization layer 114b formed of the same material as the first planarization layer 114a has a high hygroscopicity to absorb the etchant, a bottom surface of the transparent conductive layer 162 disposed on the second planarization layer 114b may be excessively etched. Therefore, the edge of the transparent conductive layer 162 is spaced apart from the second planarization layer 114b so that the edge of the transparent conductive layer 162 is not excessively etched due to the hygroscopicity of the second planarization layer 114b absorbing the etchant and the edge of the transparent conductive layer 162 may be formed to have a tapered shape.

Further, the second planarization layer 114b improves a step coverage of the transparent conductive layer 162 to lower a contact resistance between the cathode 133 and the transparent conductive layer 162. Specifically, the second planarization layer 114b may be formed to be flat and gentle. Further, since the transparent conductive layer 162 which covers the second planarization layer 114b is also formed along the surface of the second planarization layer 114b, the transparent conductive layer 162 may have a flatter surface. Therefore, the thickness of the cathode 133 formed on the second planarization layer 114b and the transparent conductive layer 162 having a flat surface may be more uniformized. Therefore, the second planarization layer 114b is disposed to improve a step coverage of the transparent conductive layer 162 and the cathode 133 formed on the transparent conductive layer 162 is also formed to have a uniform thickness. Therefore, the contact resistance between the cathode 133 and the transparent conductive layer 162 may be lowered.

Referring to FIG. 6 and FIG. 3 together, the first planarization layer 114a and the second planarization layer 114b are disposed to be spaced apart from each other in the contact area CA so that there is an area in the contact area CA where the first planarization layer 114a and the second planarization layer 114b are not disposed. For example, the first planarization layer 114a is disposed below the contact unit 160 of the contact area CA and the second planarization layer 114b is disposed above the contact unit 160. Further, a separate planarization layer is not disposed in an intermediate portion of the contact unit 160. Further, the intermediate portion of the contact unit 160 where the first planarization layer 114a and the second planarization layer 114b are not disposed may block the permeating path of the moisture through the first planarization layer 114a and the second planarization layer 114b. Therefore, the first planarization layer 114a and the second planarization layer 114b are spaced apart from each other with the intermediate portion of the contact unit 160 therebetween. As a result, even though the moisture permeates into the second planarization layer 114b, the moisture may be hardly transmitted from the second planarization layer 114b to the first planarization layer 114a.

The edge of the transparent conductive layer 162 is disposed on the passivation layer 113 in a side portion of the intermediate portion of the contact unit 160 which is adjacent to the routing area RA. At this time, in some cases, the edge of the transparent conductive layer 162 disposed on the passivation layer 113 may be formed to be similar to a reverse tapered shape, rather than the tapered shape. In this case, the thickness of the cathode 133 is not uniform in the vicinity of the edge of the transparent conductive layer 162 so that the resistance of the cathode 133 may be increased. However, even though the resistance is increased in the side portion of the contact unit 160, the resistance in an upper portion and a lower portion of the contact unit 160 is reduced so that an overall resistance of the contact unit 160 may be reduced. Specifically, even though the resistance of the cathode 133 is increased in the side portion of the contact unit 160, the first planarization layer 114a and the second bank 115b are disposed in the lower portion of the contact unit 160 so that the resistance increase of the cathode 133 due to the edge of the transparent conductive layer 162 having a reverse tapered shape is reduced. Further, the step coverage of the transparent conductive layer 162 is improved by the second planarization layer 114b in the upper portion of the contact unit 160 to minimize the resistance increase of the cathode 133 so that the overall contact resistance of the contact unit 160 may be reduced.

In the display device 100 according to the exemplary embodiment of the present disclosure, the first planarization layer 114a and the second planarization layer 114b are spaced apart from each other so that the permeation of the moisture into the display area AA through the second planarization layer 114b and the first planarization layer 114a may be reduced. The first planarization layer 114a disposed in the display area AA and a part of the non-display area NA is disposed to be spaced apart from the second planarization layer 114b disposed in the contact area CA. The first planarization layer 114a and the second planarization layer 114b have a fast moisture absorbing property. When the second planarization layer 114b adjacent to an outermost side of the display device 100 is integrally formed with the first planarization layer 114a, the moisture which permeates into the second planarization layer 114b may be easily transmitted to the first planarization layer 114a. Therefore, the first planarization layer 114a and the second planarization layer 114b are spaced apart from each other so that even though the moisture permeates into the second planarization layer 114b, the moisture is not transmitted to the first planarization layer 114a. Accordingly, in the display device 100 according to the exemplary embodiment of the present disclosure, the second planarization layer 114b is spaced apart from the first planarization layer 114a. As a result, the permeation of the moisture into the display area AA may be reduced and the deterioration of the organic light emitting diode 130 due to the moisture may be minimized.

In the meantime, the display device 100 according to the exemplary embodiment of the present disclosure disposes the second planarization layer 114b in the non-display area NA so that a contact hole CH from which both the second planarization layer 114b and the passivation layer 113 are removed may be easily formed. Specifically, the second planarization layer 114b and the passivation layer 113 may be formed using one halftone mask. When the halftone mask is used, areas may be classified into a full open area in which both the second planarization layer 114b and the passivation layer 113 are etched, a half tone area in which only the second planarization layer 114b is etched and the passivation layer 113 remains, and a full tone area in which both the second planarization layer 114b and the passivation layer 113 remain. In this case, in order to form a contact hole CH through which the metal layer 161 is in contact with the transparent conductive layer 162 in the contact unit 160, the passivation layer 113 may be etched. However, the passivation layer 113 may be etched together with the second planarization layer 114b in the contact hole CH and the contact hole CH may be a full open area in which both the second planarization layer 114b and the passivation layer 113 are etched. In this case, in order to form a full open area, a full tone area is necessary between the full open area and the half tone area. If the half tone area and the full open area are formed without the full tone area, when the full open area is formed, a part of the passivation layer 113 of the half tone area may be torn. Therefore, in the display device 100 according to the exemplary embodiment of the present disclosure, the full tone area in which the second planarization layer 114b and the passivation layer 113 remain is disposed in the contact area CA to easily form the contact hole CH of the passivation layer 113 of the contact unit 160. Therefore, since the full tone area in which the second planarization layer 114b and the passivation layer 113 remain is disposed in the contact area CA, a contact hole CH through which the metal layer 161 and the transparent conductive layer 162 are connected may be easily formed.

In addition, in the display device 100 according to the exemplary embodiment of the present disclosure, the second planarization layer 114b is disposed to improve the step coverage of the transparent conductive layer 162 and reduce the resistance of the cathode 133. The second planarization layer 114b is formed to have a flat surface and the transparent conductive layer 162 which covers the second planarization layer 114b is also formed to be flat along the surface of the second planarization layer 114b. Therefore, the transparent conductive layer 162 may have a smoother surface. Further, the cathode 133 formed on such a transparent conductive layer 162 has a uniform thickness so that the resistance increase due to the reduced thickness of the cathode 133 may be reduced. Accordingly, in the display device 100 according to the exemplary embodiment of the present disclosure, the second planarization layer 114b is disposed to improve the step coverage of the transparent conductive layer 162 and reduce the thickness change of the cathode 133. By doing this, the contact resistance between the cathode 133 and the contact unit 160 may be reduced.

In the display device 100 according to the exemplary embodiment of the present disclosure, the transparent conductive layer 162 is formed so as to cover the second planarization layer 114b to suppress over-etching in the vicinity of the edge of the transparent conductive layer 162. Further, a thickness of the cathode 133 which covers the edge of the transparent conductive layer 162 is ensured to minimize the resistance increase range. The edge of the transparent conductive layer 162 is spaced apart from the second planarization layer 114b to be similar to a tapered shape. If the edge of the transparent conductive layer 162 is disposed on the second planarization layer 114b, the hygroscopicity of the second planarization layer 114b absorbing the etchant is high so that a bottom surface in the vicinity of the edge of the transparent conductive layer 162 which is in contact with the second planarization layer 114b may be excessively etched. Further, the edge of the transparent conductive layer 162 may have a reverse tapered shape. Therefore, when the second planarization layer 114b and the edge of the transparent conductive layer 162 are spaced apart from each other, the edge of the transparent conductive layer 162 may be formed to be similar to the tapered shape. Therefore, when the transparent conductive layer 162 is formed to cover the entire second planarization layer 114b, the thickness of the cathode 133 is ensured in the vicinity of the edge of the transparent conductive layer 162 and the resistance of the cathode 133 may be lowered in the vicinity of the edge of the transparent conductive layer 162. Accordingly, in the display device 100 according to the exemplary embodiment of the present disclosure, the edge of the transparent conductive layer 162 is spaced apart from the second planarization layer 114b so that the edge of the transparent conductive layer 162 is formed to have a tapered shape. Further, the contact resistance between the cathode 133 and the contact unit 160 in the vicinity of the edge of the transparent conductive layer 162 may be reduced.

In the display device 100 according to the exemplary embodiment of the present disclosure, the second bank 115*b* which covers the edge of the transparent conductive layer 162 having a reverse tapered shape is disposed to reduce the disconnection of the cathode 133 at the edge of the transparent conductive layer 162 and lower the resistance. The edge of the transparent conductive layer 162 is disposed on the top surface of the first planarization layer 114*a*. The edge of the transparent conductive layer 162 on the top surface of the first planarization layer 114*a* may be formed to have a reverse tapered shape. Specifically, the hygroscopicity of the first planarization layer 114*a* absorbing the etchant is high so that the bottom surface of the transparent conductive layer 162 which is in contact with the first planarization layer 114*a* may be excessively etched. Further, the edge of the transparent conductive layer 162 may be formed to have a reverse tapered shape due to the over-etching of the transparent conductive layer 162 disposed on the first planarization layer 114*a*. In this case, the second bank 115*b* is disposed so as to cover the edge of the transparent conductive layer 162 having a reverse tapered shape on the first planarization layer 114*a*. Since the second bank 115*b* is disposed so as to cover the edge of the transparent conductive layer 162 having a reverse tapered shape, the direct contact of the cathode 133 and the edge of the transparent conductive layer 162 may be suppressed and the reduction of the thickness of the cathode 133 may be suppressed. Therefore, in the display device 100 according to the exemplary embodiment of the present disclosure, even though the edge of the transparent conductive layer 162 has a reverse tapered shape, the second bank 115*b* is further disposed on the edge of the transparent conductive layer 162. Therefore, the contact of the edge of the transparent conductive layer 162 and the cathode 133 may be suppressed and the increase of the resistance due to the reduced thickness of the cathode 133 may be reduced.

In the display device 100 according to the exemplary embodiment of the present disclosure, even though the resistance of the cathode 133 is high in a partial area of the contact unit 160, a design for lowering the resistance of the cathode 133 at an upper portion and a lower portion of the contact unit 160 is applied. Therefore, the overall contact resistance between the contact unit 160 and the cathode 133 may be sufficiently lowered. Specifically, in order to separate the first planarization layer 114*a* and the second planarization layer 114*b* from each other, the first planarization layer 114*a* and the second planarization layer 114*b* are not disposed in the intermediate portion of the contact unit 160. The edge of the transparent conductive layer 162 may be directly disposed on the passivation layer 113 in a side portion of the contact unit 160 which is adjacent to the routing area RA. In this case, due to various factors such as a manufacturing process or a type of material, the edge of the transparent conductive layer 162 disposed on the passivation layer 113 may be formed so as to be similar to any one of the tapered shape or the reverse tapered shape. If the edge of the transparent conductive layer 162 on the passivation layer 113 is similar to the reverse tapered shape, the thickness of the cathode 133 at the edge of the transparent conductive layer 162 is not uniform. Therefore, the resistance in the intermediate portion of the contact unit 160 which is the side portion of the contact unit 160 may be increased a little. However, in the upper portion of the contact unit 160, the second planarization layer 114*b* is disposed to increase the step coverage of the transparent conductive layer 162 and reduce the resistance of the cathode 133. In the lower portion of the contact unit 160, the first planarization layer 114*a* and the second bank 115*b* are disposed to suppress the direct contact between the edge of the transparent conductive layer 162 having a reverse tapered shape and the cathode 133 and reduce the resistance increase range of the cathode 133. Accordingly, in the display device 100 according to the exemplary embodiment of the present disclosure, even though a resistance in a partial area of the contact unit 160 is increased, a design for reducing a resistance of the cathode 133 in the upper portion and the lower portion of the contact unit 160 is applied. As a result, the overall contact resistance of the contact unit 160 and the cathode 133 may be lowered and the low potential power voltage may be smoothly supplied to the display area AA.

The exemplary embodiments of the present disclosure can also be described as follows.

According to an aspect of the present disclosure, there is provided a display device. The display device includes a substrate which includes a display area and a non-display area adjacent to the display area, a first planarization layer which is at least partially disposed in the display area, a second planarization layer which is disposed in the non-display area and is spaced apart from the first planarization layer, a contact unit disposed between the first planarization layer and the second planarization layer in the non-display area, and a cathode which extends from the display area to the non-display area to be electrically connected to the contact unit.

The contact unit may include one or more metal layers disposed below the first planarization layer and the second planarization layer, and a transparent conductive layer which is disposed on the first planarization layer and the second planarization layer and may be electrically connected to the metal layer.

The transparent conductive layer may be disposed so as to cover the entire second planarization layer.

An edge of the transparent conductive layer may be spaced apart from the second planarization layer.

An edge of the transparent conductive layer may be disposed on the first planarization layer.

The display device may further include a bank which is disposed to cover the edge of the transparent conductive layer on the first planarization layer.

An edge of a part of the transparent conductive layer extending to outside of the bank may protrude outwardly more than an edge of the other part of the transparent conductive layer which overlaps the bank.

The display device may further include a plurality of flexible films which is connected to the substrate in the non-display area. The metal layer may extend to outside of the second planarization layer to be electrically connected to the plurality of flexible films.

The display device may further include a plurality of routing areas which radially extends toward the display area from the plurality of flexible films. The contact unit may be disposed between the plurality of routing areas.

The display device may further include a plurality of light emitting diodes which includes the cathode and is disposed in the display area, and a plurality of driving elements to drive the plurality of light emitting diodes. The metal layer may be formed of the same material as a part of the plurality of driving elements, and the transparent conductive layer may be formed of the same material as an anode of the plurality of light emitting diodes.

The display device may further include one or more insulating layers which are disposed between the metal layer and the transparent conductive layer and has a contact hole formed to expose the metal layer. The metal layer which is exposed through the contact hole in the non-display area between the first planarization layer and the second planarization layer may be in contact with the transparent conductive layer.

The display device may further include a back cover which supports the substrate on one surface of the substrate, and a roller to which the substrate and the back cover are wound or unwound.

According to another aspect of the present disclosure, there is provided a display device. The display device includes a substrate which includes a display area, a plurality of routing areas extending from the display area, and a plurality of contact areas disposed between the plurality of routing areas, a plurality of flexible films which is electrically connected to the plurality of routing areas at one end of the substrate, a first planarization layer which is disposed in the display area, some of the plurality of routing areas adjacent to the display area, and some of the plurality of contact areas adjacent to the plurality of routing areas, a second planarization layer which is disposed in the plurality of contact areas and is spaced apart from the first planarization layer, a cathode which is disposed in the display area, some of the plurality of routing areas adjacent to the display area, and some of the plurality of contact areas adjacent to the display area, and a contact unit which is disposed in each of the plurality of contact areas and is electrically connected the cathode. The plurality of routing areas is radially disposed with respect to the plurality of flexible films and the plurality of contact areas is radially disposed with respect to the display area.

The contact unit may include one or more metal layers disposed below the first planarization layer and the second planarization layer, and a transparent conductive layer which is disposed on the first planarization layer and the second planarization layer and is electrically connected to the metal layer, and a part of an edge of the transparent conductive layer may be disposed on a top surface of the first planarization layer disposed in the plurality of contact areas.

The metal layer may extend to outside of the transparent conductive layer toward the plurality of flexible films to be electrically connected to the plurality of flexible films.

In the plurality of contact areas, an edge of the first planarization layer may be disposed along an edge of the plurality of routing areas to have a concave shape, and in the plurality of routing areas, the edge of the first planarization layer may be disposed to be parallel to an edge of the display area.

The display device may further include a bank which simultaneously covers a part of the edge of the transparent conductive layer and the first planarization layer in the plurality of contact areas. The bank may have a V shape.

The second planarization layer may be disposed to be parallel to an edge of the display area and a side surface and a top surface of the second planarization layer may be in contact with the transparent conductive layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a substrate which includes a display area and a non-display area adjacent to the display area;
    a plurality of light emitting diodes which are disposed in the display area and include an anode and a cathode;
    a plurality of driving elements to drive the plurality of light emitting diodes;
    a first planarization layer which is at least partially disposed in the display area;
    a second planarization layer which is disposed in the non-display area and is spaced apart from the first planarization layer; and
    a contact unit disposed between the first planarization layer and the second planarization layer in the non-display area,
    wherein the cathode extends from the display area to the non-display area to be electrically connected to the contact unit,
    wherein the contact unit includes:
    one or more metal layers disposed below the first planarization layer and the second planarization layer in the non-display area; and
    a transparent conductive layer which is disposed on the first planarization layer and the second planarization layer in the non-display area and is electrically connected to the one or more metal layers,
    wherein a metal layer in the one or more metal layers is formed of a same material as a part of the plurality of driving elements, and
    wherein the transparent conductive layer is formed of a same material as the anode of the plurality of light emitting diodes.

2. The display device according to claim 1, wherein the transparent conductive layer is disposed so as to cover an entire second planarization layer.

3. The display device according to claim 2, wherein an edge of the transparent conductive layer is spaced apart from the second planarization layer.

4. The display device according to claim 1, wherein an edge of the transparent conductive layer is disposed on the first planarization layer.

5. The display device according to claim 4, further comprising:
    a bank which is disposed to cover the edge of the transparent conductive layer on the first planarization layer.

6. The display device according to claim 5, wherein an edge of a part of the transparent conductive layer extending outside of the bank protrudes more outward than an edge of another part of the transparent conductive layer which overlaps the bank.

7. The display device according to claim 1, further comprising:
    a plurality of flexible films which are connected to the substrate in the non-display area,
    wherein the one or more metal layers extend to outside of the second planarization layer to be electrically connected to the plurality of flexible films.

8. The display device according to claim 7, further comprising:
    a plurality of routing areas which radially extend toward the display area from the plurality of flexible films, wherein the contact unit is disposed between the plurality of routing areas.

9. The display device according to claim 1, further comprising:
one or more insulating layers which are disposed between a metal layer in the one or more metal layers and the transparent conductive layer and have a contact hole formed to expose the metal layer,
wherein the metal layer which is exposed through the contact hole in the non-display area between the first planarization layer and the second planarization layer is in contact with the transparent conductive layer.

10. A display device, comprising:
a substrate which includes a display area, a plurality of routing areas extending from the display area, and a plurality of contact areas disposed between the plurality of routing areas;
a plurality of flexible films which are electrically connected to the plurality of routing areas at one end of the substrate;
a first planarization layer which is disposed in the display area, some of the plurality of routing areas adjacent to the display area, and some of the plurality of contact areas adjacent to the plurality of routing areas;
a second planarization layer which is disposed in the plurality of contact areas and is spaced apart from the first planarization layer;
a cathode which is disposed in the display area, some of the plurality of routing areas adjacent to the display area, and some of the plurality of contact areas adjacent to the display area; and
a contact unit which is disposed in each of the plurality of contact areas and is electrically connected the cathode,
wherein the plurality of routing areas are radially disposed with respect to the plurality of flexible films and the plurality of contact areas are radially disposed with respect to the display area.

11. The display device according to claim 10, wherein the contact unit includes:
one or more metal layers disposed below the first planarization layer and the second planarization layer; and
a transparent conductive layer which is disposed on the first planarization layer and the second planarization layer and is electrically connected to the one or more metal layers, and
wherein a part of an edge of the transparent conductive layer is disposed on a top surface of the first planarization layer disposed in the plurality of contact areas.

12. The display device according to claim 11, wherein the one or more metal layers extend outside of the transparent conductive layer toward the plurality of flexible films to be electrically connected to the plurality of flexible films.

13. The display device according to claim 11, wherein in the plurality of contact areas, an edge of the first planarization layer is disposed along an edge of the plurality of routing areas to have a concave shape, and
in the plurality of routing areas, the edge of the first planarization layer is disposed to be parallel to an edge of the display area.

14. The display device according to claim 11, further comprising:
a bank which simultaneously covers the part of the edge of the transparent conductive layer and a part of an edge of the first planarization layer in the plurality of contact areas,
wherein the bank has a V-shape.

15. The display device according to claim 11, wherein the second planarization layer is disposed to be parallel to an edge of the display area and a side surface and a top surface of the second planarization layer are in contact with the transparent conductive layer.

* * * * *